United States Patent [19]
Marshall

[11] Patent Number: 5,390,069
[45] Date of Patent: Feb. 14, 1995

[54] SHORT CIRCUIT LIMIT CIRCUIT WITH TEMPERATURE-DEPENDENT CURRENT LIMIT

[75] Inventor: Andrew Marshall, Dallas, Tex.

[73] Assignee: Texas Instruments Incorporated, Dallas, Tex.

[21] Appl. No.: 126,726

[22] Filed: Sep. 24, 1993

Related U.S. Application Data

[63] Continuation of Ser. No. 726,473, Jul. 8, 1991, abandoned.

[51] Int. Cl.⁶ .......................................... H03K 17/30
[52] U.S. Cl. ...................................... 361/103; 361/93
[58] Field of Search ..................... 361/103, 93, 106; 323/277, 279, 281

[56] References Cited

U.S. PATENT DOCUMENTS

| | | | |
|---|---|---|---|
| 3,796,943 | 3/1974 | Nelson et al. | 323/9 |
| 3,845,405 | 10/1974 | Leidich | 330/207 P |
| 4,553,048 | 11/1985 | Bynum et al. | 361/103 |
| 4,800,331 | 1/1989 | Vesce et al. | 361/106 |

Primary Examiner—Marc S. Hoff
Assistant Examiner—S. Jackson
Attorney, Agent, or Firm—W. James Brady, III; Richard L. Donaldson

[57] ABSTRACT

A current limit circuit is provided, with a DMOS output transistor DM2. A second DMOS transistor DM1 is provided in parallel with DM2. A pair of matched resistors R12 and R13 are connected to a reference current source and to DM1. If the voltage across R13 exceeds the voltage across R12, a control circuit sinks current away from DM1.

11 Claims, 2 Drawing Sheets

SHORT CIRCUIT LIMIT CIRCUIT WITH TEMPERATURE-DEPENDENT CURRENT LIMIT This application is a continuation of application Ser. No. 07/726,473 abandoned, filed Jul. 8, 1991.

BACKGROUND OF THE INVENTION

There is an increasing diversity of requirements for intelligent power ICs, which have to provide protection for thermal limit, transients, overvoltage and short circuit loads. Since the requirements are in addition to the normal requirements for proper functioning of an integrated circuit, there is a need for circuitry which accomplishes the above requirements without being overly complex and which requires a minimum of area on an integrated circuit chip.

A recent requirement has arisen specifically for a short circuit current limit on an intelligent power IC which has an intentional and controlled reduction in current limit as the device temperature increases.

DETAILED DESCRIPTION OF THE PREFERRED EMBODIMENT

There is a need for a current limited circuit with a short circuit operation having a negative temperature coefficient, allowing more current to pass at low temperatures before a short circuit condition occurs, than is allowed to pass at high temperatures.

Figure 1:
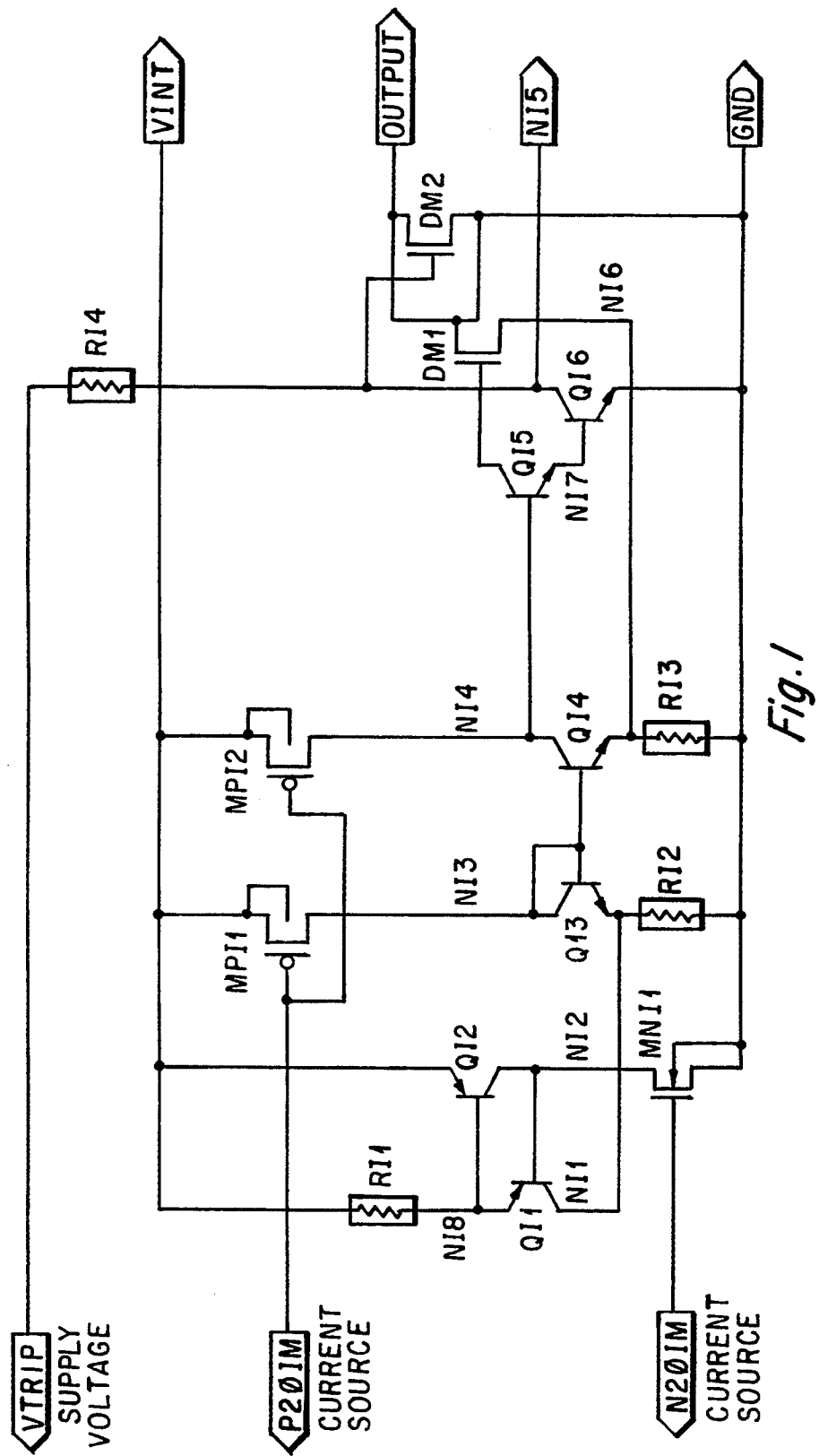
FIG. 1 is a schematic of the present invention.

Referring to FIG. 1, the circuit of the present invention is shown and is referred to generally with a reference numeral 10. The limit circuit 10 has a DMOS supply voltage shown as VTRIP in FIG. 1. An internal logic voltage supply is also supplied at VINT, as well as references voltages P20IM and N20IM. The DMOS supply voltage VTRIP is provided to the gates of DMOS output device DM2, as well as to the gate of a sensefet structure DM1 embedded within DM2. The DMOS supply voltage is supplied through device R14, which may be either a resistor or an inductor. The drains of DM1 and DM2 are connected to the output node as well as to ground. The emitter of DM2 is connected to capacitor 2, the drain of DM2 and to ground. The source of DM1 is coupled to ground through a resistor R13. A pair of NPN transistors Q15 and Q16 are connected in a Darlington configuration, with their collectors coupled to the gates of DMOS transistors DM1 and DM2 as well as to gate voltage terminal N15. The emitter of transistor Q 15 is connected to the base of transistor Q16, while the emitter of transistor Q16 is connected to ground.

A comparator circuit consisting of matched NPN transistors Q13 and Q14 is also provided. The emitters of transistor Q13 and Q14 are connected to ground through resistors R12 and R13, respectively. The bases of transistors Q13 and Q14 are connected together, as well as to the collector of transistor Q13. The collectors of transistors Q13 and Q14 are connected to the outputs of current sources consisting of P-channel transistors MP11 and MP12. The drains of MOS transistors MP11 and MP12 are connected to VINT while their gates are coupled together and connected to P20IM, a reference voltage. A PNP bipolar transistor Q12 has its emitter connected to VINT, and its collector coupled to the drain of an N-channel field effect transistor MN11. The source of transistor MN11 is connected to ground, while its gate is connected to N20IM, a reference voltage source. The base of transistor Q 12 is coupled to VINT through resistor R11 and to the emitter of PNP transistor Q11. The collector of transistor Q11 is coupled to the emitter of transistor Q13, while the base of transistor Q11 is coupled to the collector of transistor Q12.

Transistors Q13 and Q14 are a matched comparator, monitoring the voltage difference at the heads of matched resistors R12 and R13. Q11 and Q12, with resistor R11 are the temperature-dependent current source, which create a voltage at resistor R12. At the point where the current through DM1 (which is proportional to the current through DM2) reaches a critical value the comparator switches, and the Darlington configuration of transistors Q15 and Q16 pull the gate voltage of DM1 and DM2 down, limiting the current. In the preferred embodiment the critical value of current through DM1 is approximately 4 milliamps. The current limit variation over temperature depends upon the base emitter voltage variation of Q12 over temperature, and the resistance variation of resistor R11 over temperature. Since base emitter voltage coefficient is normally negative and resistance coefficient is normally positive a net reduction in current is accomplished using the configuration of the preferred embodiment.

Transistors Q11, Q12 with resistor R11 and N-channel FET MN11 create a variable reference current, which flows out of the collector of Q11. The current is generated when MN11 sinks current from the base of Q11 and the collector of Q12. This enables Q11 to turn on, sinking current through resistor R11 and the base of Q12. As Q12 turns on more current for the current sink MN11 is sourced from Q12, until an equilibrium point is reached. With high gain transistors, this equilibrium is the point where the current through R11 defines the Q11 collector current. This current is highly temperature dependent. As temperature increases the base emitter voltage across Q12 is reduced, typically by about 2 millivolts per degree centigrade of temperature increase. In addition the resistance of the diffused resistor R11 increases with temperature, in the preferred embodiment by about 0.2% per centigrade degree. The resulting effect is a temperature dependent reference current.

The section of the circuit comprising the current source consisting of P-channel field effect transistors MP11 and MP12, bipolar transistors Q13 and Q14, and resistors R12 and R13 create a comparator. The comparator is capable of detecting voltage differences very close to the ground rail of the integrated circuit, and provides a gained up output at node N14. P-channel field effect transistors MP11 and MP12 provide equal currents into transistors Q13 and Q14 respectively at the balance point. Resistor values R12 and R13 are chosen such that the current from transistors MP11 and MP12 do not significantly effect the voltages at the emitters of transistors Q13 and Q14. Variation of the voltages at the emitters of Q13 and Q14 are created by the reference current from transistor Q11, feeding into resistor R12 and current from the sensefet DM1 feeding into resistor R13. Resistors R12 and R13 have matched temperature coefficients and are laid out in the IC to be closely matched. The ratio of resistors R12 to R13 gives the ratio of the sensefet current to that of the reference current for comparator balance. The output structure of the limit circuit 10 consists of a passive device (a resistor or inductor) R14 and DMOS devices DM1 and DM2. The voltage supplied through VTRIP is at a high level (approximately 10 volts in the preferred embodiment) when the DMOS output at DM2 is on, and low at other times. Resistor R14 is provided so current can be sunk through the Darlington configuration of transistors Q15 and Q16 during short circuit operation. The sensefet DM1 is a part of the DMOS output, and produces a current proportional to DM2 approximately in the ratio of the number of cells in the sensefet to the number of cells in the DMOS.

The output at node N14 drives the Darlington combination Q15 and Q16, which in the event of the sensefet (DM1) current exceeding the value which causes the voltage at resistor R13 to exceed that across resistor R12 will cause the voltage at node N14 to rise, turning transistors Q15 and Q16 on. This pulls the gate voltage at DM1 and DM2 down, reducing the current capability of DM2 and thus limiting the current. The feedback loop maintains the current limit until the short circuit is removed or the voltage at VTRIP is removed.

This circuit is especially beneficial when combined with loads which are expected to reduce in the current at higher temperatures, when the circuit described can switch into short circuit limit operation at a reduced current level.

Figure 2:
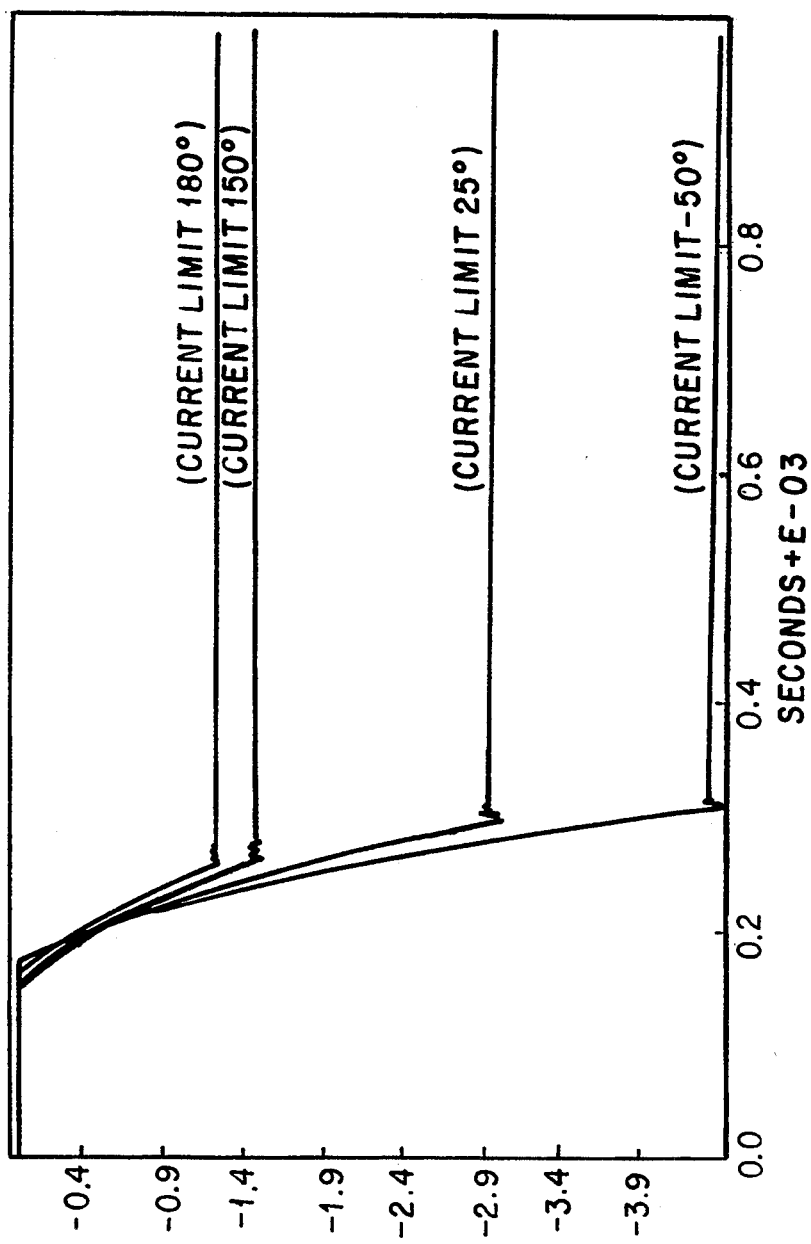
FIG. 2 is a waveform diagram showing the output of the invention of FIG. 1.

The current limit variation over temperature is shown in FIG. 2. In FIG. 2, the output voltage is held at ten volts, with VINT at 7 volts. The output shown in FIG. 2 represents the current levels at the drain of DM2 for various temperatures. As shown in FIG. 2, the current level during the current limit at 180 degrees is 1.27 amps, while the current limit at −50 degrees is approximately 4.38 amps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A current limit circuit, comprising:
   an output transistor having a current path connected to a first output node;
   a sensing circuit connected to said output transistor for producing a current that is proportional to the current in the current path of the output transistor;
   a current reference circuit for producing a reference current, said reference current being a function of temperature;
   a comparator having a first input for receiving said current produced by said sensing circuit, a second input for receiving said reference current, and a comparator output, said comparator comparing said current produced by said sensing circuit with said reference current to produce a control signal at said comparator output; and
   a control circuit connected to a control electrode of said output transistor and responsive to said control signal for controlling a voltage at the control electrode of said output transistor to limit current through said current path of said output transistor.

2. The current limit circuit of claim 1 in which the current path of said output transistor is connected between said first output node and a source of reference potential and said sensing circuit includes a first transistor having a current path connected between said first output node and said first input of said comparator.

3. The current limit circuit of claim 2 in which said output transistor and first transistor are DMOS transistors.

4. The current limit circuit of claim 2 in which said output transistor and said first transistor have control electrodes connected to a supply voltage through a passive device and said control circuit includes a second transistor having a current path connected between said control electrodes of said output transistor and said first transistor and said source of reference potential.

5. The current limit circuit of claim 4 in which said source of reference potential is ground.

6. The current limit circuit of claim 4 in which said control circuit includes a third transistor having a control electrode connected to said comparator output for receiving said control signal and a current path connected between said control electrodes of said output and first transistors and a control electrode of said second transistor.

7. The current limit circuit of claim 6 in which said second and third transistors are NPN transistors each having an emitter, base, and collector, the base of said second transistor connected to the emitter of said third transistor, the emitter of said second transistor connected to said source of reference potential, the collectors of said second and third transistors connected to said control electrodes of said output and first transistors, the base of said third transistor connected to said comparator output.

8. The current limit circuit of claim 1 in which said comparator includes a first and second current sources, first and second transistors, and first and second resistors, said first current source, a current path of said first transistor and said first resistor being connected in series, said second current source, a current path of said second transistor and said second resistor being connected in series, said first input connected to a node between said current path of said first transistor and said first resistor, said second input connected to a node between said current path of said second transistor and said second resistor, said comparator output connected to a node between said first current source and the current path of said first transistor.

9. The current limit circuit of claim 8 in which said first and second transistors are NPN transistors each having an emitter, base, and collector, the collector of said first transistor connected to said first current source, the emitter of said first transistor connected to said first resistor, the base of said first transistor and the base and collector of said second transistor connected to said second current source, the emitter of said second transistor connected to said second resistor.

10. The current limit circuit of claim 1 in which said current reference circuit includes a resistor, a first transistor, a second transistor, and a third transistor, said resistor and a current path of said first transistor connected in series between a first supply voltage and said second input, a current path of said second transistor and a current path of said third transistor connected in series between said first supply voltage and a source of reference potential, a control electrode of said first transistor connected to a node between the current paths of said second and third transistors, a control electrode of said second transistor connected to a node between said resistor and the current path of said first transistor, a control electrode of said third transistor connected to a reference supply voltage.

11. The current limit circuit of claim 10 in which said first and second transistors are PNP transistors each having an emitter, base, and collector and said third transistor is an N-channel field effect transistor having a gate, source, and drain, the emitter of said first transistor connected to said resistor, the base of said first transistor connected to the collector of said second transistor and the drain of said third transistor, the collector of said first transistor connected to said second input, the emitter of said second transistor connected to said first supply voltage, the base of said second transistor connected to the emitter of said first transistor, the collector of said second transistor connected to the base of said first transistor and the drain of said third transistor, the gate of said third transistor connected to a second voltage supply, the source of said third transistor connected to a source of reference potential.

* * * * *

(12) EX PARTE REEXAMINATION CERTIFICATE (5762nd)
United States Patent
Marshall

(10) Number: US 5,390,069 C1
(45) Certificate Issued: May 8, 2007

(54) SHORT CIRCUIT LIMIT CIRCUIT WITH TEMPERATURE-DEPENDENT CURRENT LIMIT

(75) Inventor: Andrew Marshall, Dallas, TX (US)

(73) Assignee: Texas Instruments, Inc., Dallas, TX (US)

Reexamination Request:
No. 90/006,918, Jan. 26, 2004

Reexamination Certificate for:
Patent No.: 5,390,069
Issued: Feb. 14, 1995
Appl. No.: 08/126,726
Filed: Sep. 24, 1993

Related U.S. Application Data

(63) Continuation of application No. 07/726,473, filed on Jul. 8, 1991, now abandoned.

(51) Int. Cl.
*H02H 5/04* (2006.01)

(52) U.S. Cl. ...................... 361/103; 361/93.8
(58) Field of Classification Search ................. 361/103, 361/93.8
See application file for complete search history.

(56) References Cited

U.S. PATENT DOCUMENTS

| 3,753,078 | A | | 8/1973 | Hedel |
|---|---|---|---|---|
| 3,796,943 | A | | 3/1974 | Nelson et al. |
| 4,023,111 | A | | 5/1977 | Mortensen |
| 4,533,845 | A | | 8/1985 | Bynum et al. |
| 4,553,084 | A | | 11/1985 | Wrathall |
| 4,779,062 | A | * | 10/1988 | Scheraga ...................... 330/298 |
| 4,851,953 | A | | 7/1989 | O'Neill et al. |
| 5,008,586 | A | * | 4/1991 | Miyazaki et al. ........... 323/315 |
| 5,008,771 | A | * | 4/1991 | Palara ........................ 361/103 |
| 5,061,863 | A | | 10/1991 | Mori et al. |

FOREIGN PATENT DOCUMENTS

JP A-1-311819 12/1989

OTHER PUBLICATIONS

Schultz, *Lossless Current Sensing with SENSFETs Enhances Motor Drive Design*, pp. 30–34, PCIM, Apr. 1986.
Young, *Current Sensing HEXSense Power MOSFETs Simplify SMPS Designs and Lower Losses*, pp. 76–83, PCIM, Jul. 1987.
Unitrode UC1846/7 Datasheet, Jan. 1997. (Not prior art but referenced by Young article, item CB).
Linear Technology LT137A Datasheet, 1990, no month.
Linear Technology LT1005 Datasheet, 1990, no month.
Linear Technology LT1033 Datasheet, 1990, no month.
Linear Technology LT1035 Datasheet, 1985, no month.
Linear Technology LT1036 Datasheet, 1986, no month.
Linear Technology LT1070 Datasheet, 1986, no month.
Linear Technology LT1073 Datasheet, 1992, no month.
Linear Technology LT1083/4/5 Datasheet, 1988, no month.
Linear Technology LT1086 Datasheet, 1988, no month.

* cited by examiner

*Primary Examiner*—Ronald W. Leja

(57) ABSTRACT

A current limit circuit is provided, with a DMOS output transistor DM2. A second DMOS transistor DM1 is provided in parallel with DM2. A pair of matched resistors R12 and R13 are connected to a reference current source and to DM1. If the voltage across R13 exceeds the voltage across R12, a control circuit sinks current away from DM1.

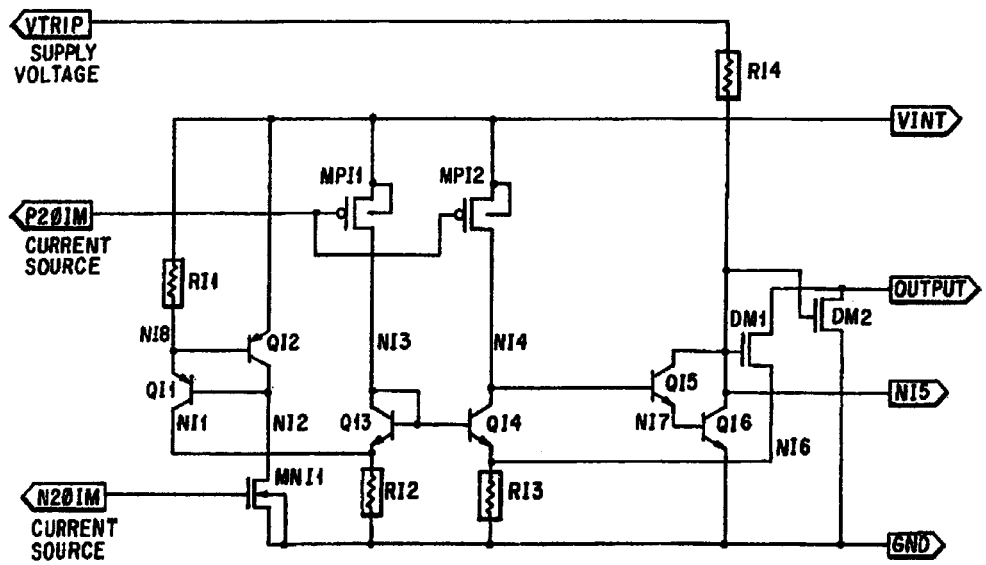

*Amended*

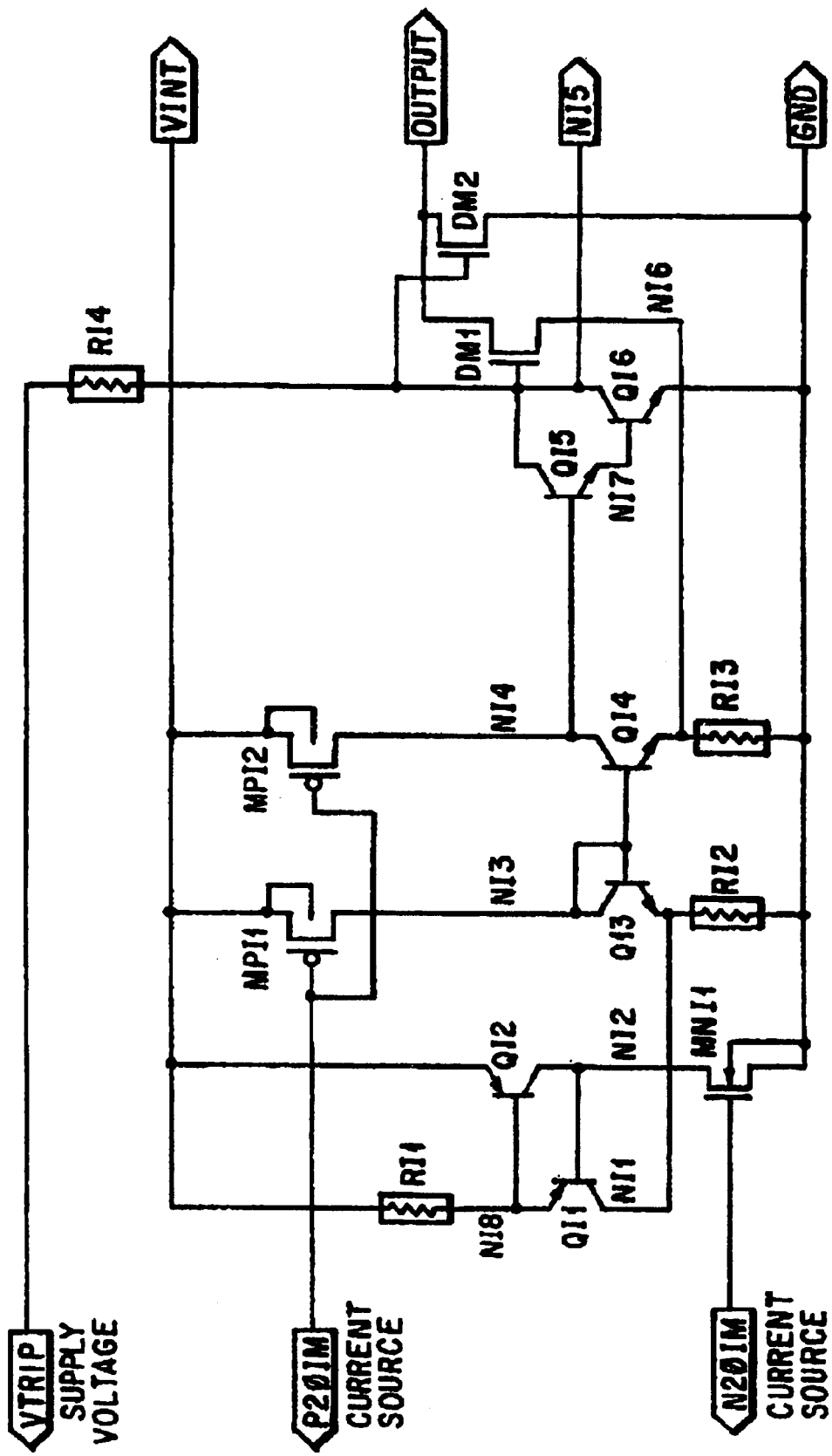
Fig.1
Amended

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, lines 35–56:

Referring to FIG. 1, the circuit of the present invention is shown and is referred to generally with a reference numeral 10. The limit circuit 10 has a DMOS supply voltage shown as VTRIP in FIG. 1. An integral logic voltage supply is also supplied at VINT, as well as references voltages P20IM and N20IM. The DMOS supply voltage VTRIP is provided to the gates of DMOS output device DM2, as well as to the gate of a sensefet structure DM1 embedded within DM2. The DMOS supply voltage is supplied through device R14, which may be either a resistor or an inductor. The drains of DM1 and DM2 are connected to the ouput node [as well as to ground]. [The emitter of DM2 is connected to capacitor 2, the drain of DM2 and to ground.] The source of DM1 is coupled to ground through a resistor R13. A pair of NPN transistors Q15 and Q16 are connected in a Darlington configuration, with their collectors coupled to the gates of DMOS transistors DM1 and DM2 as well as to gate voltage terminal N15. The emitter of transistor Q 15 is connected to the base of transistor Q16, while the emitter of transistor Q16 is connected to ground.

THE DRAWING FIGURES HAVE BEEN CHANGED AS FOLLOWS:

Lead between drain of DM1 and source of DM2 deleted.
Collectors of Q15 and Q16 connected.

AS A RESULT OF REEXAMINATION, IT HAS BEEN DETERMINED THAT:

Claims 1 and 2 are determined to be patentable as amended.

Claims 3, 4, 5, 6, 7, 8, 9, 10 and 11, dependent on an amended claim, are determined to be patentable.

New claims 12–77 and 78 are added and determined to be patentable.

1. A current limit circuit, comprising:
an output transistor having a current path connected to a first output node;
a sensing circuit *including a sense transistor having a current path* connected to said output transistor *at said first output node* for producing a current that is proportional to the current in the current path of the output transistor;
a current reference circuit for producing a reference current, said reference current being a function of temperature *and having a first magnitude at a first temperature and having a second magnitude less than said first magnitude at a second temperature greater than said first temperature*;
a comparator having a first input *connected to said current path of said sense transistor* for receiving said current produced by said sensing circuit, a second input for receiving said reference current, and a comparator output, said comparator comparing said current produced by said sensing circuit with said reference current to produce a control signal at said comparator output; and
a control circuit connected to a control electrode of said output transistor and responsive to said control signal for controlling a voltage at the control electrode of said output transistor to limit current through said current path of said output transistor.

2. The current limit of claim 1 in which the current path of said output transistor is connected between said first output node and a source of reference potential [and said sensing circuit includes a first transistor having a current path connected between said first output node and said first input of said comparator].

*12. The current limit circuit of claim 1, wherein the current produced by the sensing circuit is less in magnitude than the current in the current path of the output transistor.*

*13. The current limit circuit of claim 1, wherein the comparator comprises a first transistor of a first conductivity type in series with a second transistor of a second conductivity type and a third transistor of the first conductivity type in series with a fourth transistor of the second conductivity type, the first and second transistors in parallel with the third and fourth transistors.*

*14. The current limit circuit of claim 1, wherein the comparator comprises a first current path for receiving said current produced by said sensing circuit, and a second current path parallel to the first current path for receiving said reference current.*

*15. The current limit circuit of claim 1, wherein the control circuit comprises a Darlington pair of transistors connected to a control electrode of said output transistor.*

*16. The current limit circuit of claim 1, wherein said current through said current path has a first limit at a first temperature and a second limit less in magnitude than said first limit at a second temperature greater than said first temperature.*

*17. The current limit circuit of claim 1, wherein said reference current is independent of said current produced by the sensing circuit.*

*18. A current limit circuit, comprising:*
*an output transistor having a current path connected to a first output node;*
*a sensing circuit including a sense transistor having a current path connected to said output transistor at said first output node for producing a current that is proportional to the current in the current path of the output transistor;*
*a current reference circuit for producing a reference current, said reference current being a function of temperature;*
*a comparator having a first input connected to said current path of said sense transistor for receiving said current produced by said sensing circuit, a second input for receiving said reference current, and a com-* parator output, said comparator comparing said current produced by said sensing circuit with said reference current to produce a control signal at said comparator output; and a control circuit connected to a control electrode of said output transistor and responsive to said control signal for controlling a voltage at the control electrode of said output transistor to limit current through said current path of said output transistor, said current through said current path having a first limit at a first temperature and having a second limit less in magnitude than said first limit at a second temperature greater than said first temperature.

19. The current limit circuit of claim 18, wherein the output transistor current path comprises parallel paths connected to the first output node.

20. The current limit circuit of claim 18, wherein the comparator comprises a first current path responsive to the first input and a second current path parallel to the first current path and responsive to the second input.

21. The current limit circuit of claim 18, wherein the current produced by the sensing circuit is less in magnitude that the current in the current path of the output transistor.

22. The current limit circuit of claim 18, wherein the comparator comprises:

a first transistor of a first conductivity type for receiving said current produced by said sensing circuit;

a second transistor of the first conductivity type for receiving said reference current;

a third transistor of a second conductivity type having a current path in series with a current path of the first transistor; and a fourth transistor of the second conductivity type having a current path in series with a current path of the second transistor.

23. The current limit circuit of claim 18, wherein the comparator comprises:

a first current path for receiving said current produced by said sensing circuit; and a second current path parallel to the first current path for receiving said reference current.

24. The current limit circuit of claim 18, comprising bipolar and MOS transistors.

25. The current limit circuit of claim 18, wherein the control circuit comprises a Darlington pair of transistors connected to a control electrode of said output transistor.

26. The current limit circuit of claim 18, wherein said reference current is independent of said current produced by the sensing circuit.

27. A current limit circuit having bipolar and MOS transistors, comprising:

an output transistor having a current path comprising parallel paths connected to a first output node;

a sensing circuit including a sense transistor having a current path connected to said output transistor at said first output node for producing a current that is proportional to the current in the current path of the output transistors;

a current reference circuit for producing a reference current, said reference current being a function of temperature;

a comparator having a first input connected to said current path of said sense transistor for receiving said current produced by said sensing circuit, a second input for receiving said reference current, and a comparator output, said comparator comparing said current produced by said sensing circuit with said reference current to produce a control signal at said comparator output; and a control circuit connected to a control electrode of said output transistor and responsive to said control signal for controlling a voltage at the control electrode of said output transistor to limit current through said current path of said output transistor.

28. The current limit circuit of claim 27, wherein the comparator comprises a first current path responsive to the first input and a second current path parallel to the first current path and responsive to the second input.

29. The current limit circuit of claim 27, wherein the current produced by the sensing circuit is less in magnitude than the current in the current path of the output transistor.

30. The current limit circuit of claim 27, wherein the comparator comprises:

a first transistor of a first conductivity type for receiving said current produced by said sensing circuit;

a second transistor of the first conductivity type for receiving said reference current;

a third transistor of a second conductivity type having a current path in series with a current path of the first transistor; and a fourth transistor of the second conductivity type having a current path in series with a current path of the second transistor.

31. The current limit circuit of claim 27, wherein the comparator comprises:

a first current path for receiving said current produced by said sensing circuit; and a second current path parallel to the first current path for receiving said reference current.

32. The current limit circuit of claim 27, wherein the control circuit comprises a Darlington pair of transistors connected to the control electrode of said output transistor.

33. The current limit circuit of claim 27, wherein said reference current is independent of said current produced by the sensing circuit.

34. A current limit circuit having bipolar and MOS transistors, comprising:

an output transistor having a current path connected to a first output node;

a sensing circuit including a sense transistor having a current path connected to said output transistor at said first output node for producing a current that is proportional to the current in the current path of the output transistor;

a current reference circuit for producing a reference current, said reference current being a function of temperature;

a comparator having a first current path responsive to a first input connected to said current path of said sense transistor for receiving said current produced by said sensing circuit, a second current path parallel to the first current path and responsive to a second input for receiving said reference current, and a comparator output, said comparator comparing said current produced by said sensing circuit with said reference current to produce a control signal at said comparator output; and a control circuit connected to a control electrode of said output transistor and responsive to said control signal for controlling a voltage at the control electrode of said output transistor to limit current through said current path of said output transistor.

35. The current limit circuit of claim 34, wherein the output transistor current path comprises parallel paths connected to the first output node.

36. The current limit circuit of claim 34, wherein the current produced by the sensing circuit is less in magnitude than the current in the current path of the output transistor.

37. The current limit circuit of claim 34, wherein the comparator comprises:
   a first transistor of a first conductivity type for receiving said current produced by said sensing circuit;
   a second transistor of the first conductivity type for receiving said reference current;
   a third transistor of a second conductivity type having a current path in series with a current path of the first transistor; and
   a fourth transistor of the second conductivity type having a current path in series with a current path of the second transistor.

38. The current limit circuit of claim 34, wherein the comparator comprises:
   a first current path for receiving said current produced by said sensing circuit; and
   a second current path parallel to the first current path for receiving said reference current.

39. The current limit circuit of claim 34, wherein the control circuit comprises a Darlington pair of transistors connected to a control electrode of said output transistor.

40. The current limit circuit of claim 34, wherein said reference current is independent of said current produced by the sensing circuit.

41. A current limit circuit having bipolar and MOS transistors, comprising:
   an output transistor having a current path connected to a first output node;
   a sensing circuit including a sense transistor having a current path connected to said output transistor at said first output node for producing a current that is proportional to and less than the current in the current path of the output transistor;
   a current reference circuit for producing a reference current, said reference current being a function of temperature;
   a comparator having a first input connected to said current path of said sense transistor for receiving said current produced by said sensing circuit, a second input for receiving said reference current, and a comparator output, said comparator comparing said current produced by said sensing circuit with said reference current to produce a control signal at said comparator output; and
   a control circuit connected to a control electrode of said output transistor and responsive to said control signal for controlling a voltage at the control electrode of said output transistor to limit current through said current path of said output transistor.

42. The current limit circuit of claim 41, wherein the comparator comprises:
   a first transistor of a first conductivity type for receiving said current produced by said sensing circuit;
   a second transistor of the first conductivity type for receiving said reference current;
   a third transistor of a second conductivity type having a current path in series with a current path of the first transistor; and
   a fourth transistor of the second conductivity type having a current path in series with a current path of the second transistor.

43. The current limit circuit of claim 41, wherein the comparator comprises:
   a first current path for receiving said current produced by said sensing circuit; and
   a second current path parallel to the first current path for receiving said reference current.

44. The current limit circuit of claim 41, wherein the control circuit comprises a Darlington pair of transistors connected to a control electrode of said output transistor.

45. The current limit circuit of claim 41, wherein said reference current is independent of said current produced by the sensing circuit.

46. A current limit circuit having bipolar and MOS transistors, comprising:
   an output transistor having a current path connected to a first output node;
   a sensing circuit including a sense transistor having a current path connected to said output transistor at said first output node for producing a current that is proportional to the current in the current path of the output transistor;
   a current reference circuit for producing a reference current, said reference current being a function of temperature;
   a comparator having a first input connected to said current path of said sense transistor at first transistor of a first conductivity type for receiving said current produced by said sensing circuit, a second input at a second transistor of the first conductivity type for receiving said reference current, and a comparator output, said comparator comparing said current produced by said sensing circuit with said reference current to produce a control signal at said comparator output;
   a third transistor of a second conductivity type having a current path in series with a current path of the first transistor;
   a fourth transistor of the second conductivity type having a current path in series with a current path of the second transistor; and
   a control circuit connected to a control electrode of said output transistor and responsive to said control signal for controlling a voltage at the control electrode of said output transistor to limit current through said current path of said output transistor.

47. The current limit circuit of claim 46, wherein the comparator comprises:
   a first current path for receiving said current produced by said sensing circuit; and
   a second current path parallel to the first current path for receiving said reference current.

48. The current limit circuit of claim 46, wherein the control circuit comprises a Darlington pair of transistors connected to a control electrode of said output transistor.

49. The current limit circuit of claim 46, wherein said reference current is independent of said current produced by the sensing circuit.

50. A current limit circuit having bipolar and MOS transistors, comprising:
   an output transistor having a current path connected to a first output node;
   a sensing circuit including a sense transistor having a current path connected to said output transistor at said first output node for producing a current that is proportional to the current in the current path of the output transistor;
a current reference circuit for producing a reference current, said reference current being a function of temperature;
a comparator having a first input connected to said current path of said sense transistor at a first current path for receiving said current produced by said sensing circuit, a second input at a second current path parallel to the first current path for receiving said reference current, and a comparator output, said comparator comparing said current produced by said sensing circuit with said reference current to produce a control signal at said comparator output; and
a control circuit connected to a control electrode of said output transistor and responsive to said control signal for controlling a voltage at the control electrode of said output transistor to limit current through said current path of said output transistor.

51. The current limit circuit of claim 50, wherein the output transistor current path comprises parallel paths connected to the first output node.

52. The current limit circuit of claim 50, wherein the control circuit comprises a Darlington pair of transistors connected to a control electrode of said output transistor.

53. The current limit circuit of claim 50, wherein said reference current is independent of said current produced by the sensing circuit.

54. A current limit circuit, comprising:
an output transistor having a current path comprising parallel paths connected to a first output node;
a sensing circuit including a sense transistor having a current path connected to said output transistor at said first output node for producing a current that is proportional to the current in the current path of the output transistor;
a current reference circuit for producing a reference current, said reference current being a function of temperature;
a comparator having a first input connected to said current path of said sense transistor for receiving said current produced by said sensing circuit, a second input for receiving said reference current, and a comparator output, said comparator comparing said current produced by said sensing circuit with said reference current to produce a control signal at said comparator output; and
a control circuit including a Darlington pair of transistors connected to a control electrode of said output transistor and responsive to said control signal for controlling a voltage at the control electrode of said output transistor to limit current through said current path of said output transistor.

55. The current limit circuit of claim 54, wherein the comparator comprises a first current path responsive to the first input and a second current path parallel to the first current path and responsive to the second input.

56. The current limit circuit of claim 54, wherein the current produced by the sensing circuit is less in magnitude than the current in the current path of the output transistor.

57. The current limit circuit of claim 54, wherein the comparator comprises:
a first transistor of a first conductivity type for receiving said current produced by said sensing circuit;
a second transistor of the first conductivity type for receiving said reference current;
a third transistor of a second conductivity type having a current path in series with a current path of the first transistor; and
a fourth transistor of the second conductivity type having a current path in series with a current path of the second transistor.

58. The current limit circuit of claim 54, wherein the comparator comprises:
a first current path for receiving said current produced by said sensing circuit; and
a second current path parallel to the first current path for receiving said reference current.

59. The current limit circuit of claim 54, wherein said reference current has a first magnitude at a first temperature and a second magnitude less than said first magnitude at a second temperature greater than said first temperature.

60. The current limit circuit of claim 54, wherein said current through said current path has a first limit at a first temperature and a second limit less in magnitude than said first limit at a second temperature greater than said first temperature.

61. The current limit circuit of claim 54, wherein said reference current is independent of said current produced by the sensing circuit.

62. A current limit circuit, comprising:
an output transistor having a current path connected to a first output node;
a sensing circuit including a sense transistor having a current path connected to said output transistor at said first output node for producing a current that is proportional to and less than the current in the current path of the output transistor;
a current reference circuit for producing a reference current, said reference current being a function of temperature;
a comparator having a first input connected to said current path of said sense transistor for receiving said current produced by said sensing circuit, a second input for receiving said reference current, and a comparator output, said comparator comparing said current produced by said sensing circuit with said reference current to produce a control signal at said comparator output; and
a control circuit including a Darlington pair of transistors connected to a control electrode of said output transistor and responsive to said control signal for controlling a voltage at the control electrode of said output transistor to limit current through said current path of said output transistor.

63. The current limit circuit of claim 62, wherein the comparator comprises a first current path responsive to the first and a second current path parallel to the first current path and responsive to the second input.

64. The current limit circuit of claim 62, wherein the comparator comprises:
a first transistor of a first conductivity type for receiving said current produced by said sensing circuit;
a second transistor of the first conductivity type for receiving said reference current;
a third transistor of a second conductivity type having a current path in series with a current path of the first transistor; and
a fourth transistor of the second conductivity type having a current path in series with a current path of the second transistor.

65. The current limit circuit of claim 62, wherein the comparator comprises:
 a first current path for receiving said current produced by said sensing circuit; and
 a second current path parallel to the first current path for receiving said reference current.

66. The current limit circuit of claim 62, wherein said reference current has a first magnitude at a first temperature and a second magnitude less than said first magnitude at a second temperature greater than said first temperature.

67. The current limit circuit of claim 62, wherein said current through said current path has a first limit at a first temperature and a second limit less in magnitude than said first limit at a second temperature greater than said first temperature.

68. The current limit circuit of claim 62, wherein said reference current is independent of said current produced by the sensing circuit.

69. A current limit circuit, comprising:
 an output transistor having a current path connected to a first output node;
 a sensing circuit including a sense transistor having a current path connected to said output transistor at said first output node for producing a current that is proportional to the current in the current path of the output transistor;
 a current reference circuit for producing a reference current, said reference current being a function of temperature;
 a comparator having a first input connected to said current path of said sense transistor at a first transistor of a first conductivity type for receiving said current produced by said sensing circuit through said current path of said sense transistor, a second input at a second transistor of the first conductivity type for receiving said reference current, and a comparator output, said comparator comparing said current produced by said sensing circuit with said reference current to produce a control signal at said comparator output;
 a third transistor of a second conductivity type having a current path in series with a current path of the first transistor;
 a fourth transistor of the second conductivity type having a current path in series with a current path of the second transistor; and
 a control circuit including a Darlington pair of transistors connected to a control electrode of said output transistor and responsive to said control signal for controlling a voltage at the control electrode of said output transistor to limit current through said current path of said output transistor.

70. The current limit circuit of claim 69, wherein the comparator comprises a first current path responsive to the first input and a second current path parallel to the first current path and responsive to the second input.

71. The current limit circuit of claim 69, wherein the comparator comprises:
 a first current path for receiving said current produced by said sensing circuit; and
 a second current path parallel to the first current path for receiving said reference current.

72. The current limit circuit of claim 69, wherein said reference current has a first magnitude at a first temperature and a second magnitude less than said first magnitude at a second temperature greater than said first temperature.

73. The current limit circuit of claim 69, wherein said current through said current path has a first limit at a first temperature and a second limit less in magnitude than said first limit at a second temperature greater than said first temperature.

74. The current limit circuit of claim 69, wherein said reference current is independent of said current produced by the sensing circuit.

75. A current limit circuit having bipolar and MOS transistors, comprising:
 an output transistor having a current path connected to a first output node;
 a sensing circuit including a sense transistor having a current path connected to said output transistor at said first output node for producing a current that is proportional to the current in the current path of the output transistor;
 a current reference circuit for producing a reference current, said reference current being a function of temperature;
 a comparator having a first input connected to said current path of said sense transistor for receiving said current produced by said sensing circuit, a second input for receiving said reference current, and a comparator output, said comparator comparing said current produced by said sensing circuit with said reference current to produce a control signal at said comparator output; and
 a control circuit including a Darlington pair of transistors connected to a control electrode of said output transistor and responsive to said control signal for controlling a voltage at the control electrode of said output transistor to limit current through said current path of said output transistor.

76. The current limit circuit of claim 75, wherein said reference current has a first magnitude at a first temperature and a second magnitude less than said first magnitude at a second temperature greater than said first temperature.

77. The current limit circuit of claim 75, wherein said current through said current path has a first limit at a first temperature and a second limit less in magnitude than said first limit at a second temperature greater than said first temperature.

78. The current limit circuit of claim 75, wherein said reference current is independent of said current produced by the sensing circuit.

* * * * *